United States Patent [19]

Fogal

[11] Patent Number: 5,311,139
[45] Date of Patent: May 10, 1994

[54] FUSE CHECKER FOR TESTING INTEGRITY OF A MINIATURE, PLUG-IN FUSE WHILE THE FUSE IS INSTALLED IN AN ELECTRICAL CIRCUIT

[76] Inventor: William J. Fogal, 233 Bobby Jones Expry., Martinez, Ga. 30907

[21] Appl. No.: 897,068

[22] Filed: Jun. 11, 1992

[51] Int. Cl.$^5$ .............................................. G01R 31/02
[52] U.S. Cl. ................................... 324/550; 324/507; 324/133; 340/638
[58] Field of Search .............. 324/507, 508, 510, 537, 324/550, 555, 556, 414, 133; 340/638, 654, 656

[56] References Cited

U.S. PATENT DOCUMENTS

| | | | |
|---|---|---|---|
| 1,109,450 | 9/1914 | Mitchell | 324/556 |
| 2,186,212 | 1/1940 | Scoggin | 324/556 |
| 2,229,927 | 9/1939 | Kamper | 324/556 |
| 3,323,041 | 5/1967 | Warner | 324/510 |
| 3,820,017 | 6/1974 | Reichenbach | 324/550 |
| 4,107,602 | 8/1978 | Evans | 324/550 |

Primary Examiner—Gerard R. Strecker
Assistant Examiner—Diep Do
Attorney, Agent, or Firm—Nies, Kurz, Bergert & Tamburro

[57] ABSTRACT

A fuse checker particularly adapted for use with miniature, plug-in fuses for testing the fuses while the fuses are in operative position in an electrical circuit. The checker includes a housing from which extend a pair of parallel contact points adapted for engagement with terminal tabs that lie within terminal access openings in a fuse housing. A ground lead is provided for completing the circuit, which includes a pair of light emitting diodes that have their lenses positioned to form part of the surface of a checker housing. A separate, current limiting resistor is applied between a respective LED and one of the contact points and the ground lead. The checker housing can be a hollow structure or it can be solid, to fully encapsulate the circuit elements that are positioned within the housing.

7 Claims, 1 Drawing Sheet

FUSE CHECKER FOR TESTING INTEGRITY OF A MINIATURE, PLUG-IN FUSE WHILE THE FUSE IS INSTALLED IN AN ELECTRICAL CIRCUIT

BACKGROUND OF THE INVENTION

1. Field of the Invention

The present invention relates to a compact testing device for checking for current flow in an electrical circuit. More particularly, the present invention relates to a small, portable, hand-held testing device suitable for testing for current flow, including testing the operational integrity of miniature, plug-in, automotive-type fuses while the fuses are in position in a fuse block.

2. Description of the Related Art

Fuses of the miniature, plug-in type have largely replaced in automobiles the formerly widely used cylindrical glass fuses that were prevalent in the past. Such plug-in fuses are most often found in a unitary fuse block positioned under the dashboard or along the lower, inner side panel in the forward part of the passenger compartment of an automobile for convenient access to all the fuses, to permit simple, rapid removal and replacement of fuses as necessary. Plug-in fuses have a colored plastic housing, and the fuse link, that often is a thin strip of metal having a low melting point, is more difficult to see when the fuse is in its receptacle than was the fuse link in the formerly-used clear glass fuses.

The operational integrity of a fuse is dependent upon whether the fuse link provides a complete electrical connection between the fuse terminals. One way the operational integrity of a plug-in fuse can be determined is by removing the fuse from the fuse block and holding the fuse housing toward a light source to view the fusible link that extends between the fuse terminals, to determine whether the link has melted or separated as a result of the passage through the fuse of an excessively high current. Because of the number of such fuses provided in a modern automobile, the total number of which can easily aggregate about 10 or 12, and because the markings on the fuse block that correspond with the functional circuit in which the fuse is operative are not always entirely clear, determining which of the number of the fuses in the fuse block might have become inoperative could require the removal, visual inspection, and reinstallation of several of the fuses.

Sometimes a continuity checker having a single probe point is utilized, but such a checker must be separately applied to each of the fuse terminals, which requires that two applications of the continuity checker, one application to each of the fuse terminals, be made to test a fuse.

It is an object of the present invention to provide a simple-to-use test device for testing for current flow in an electrical circuit.

It is another object of the present invention to provide a portable, hand-held fuse checker that can be used to check the integrity of a plug-in type fuse without removing the fuse from the fuse block.

It is a further object of the present invention to provide a fuse checker that can be used to test the integrity of a fuse with only a single application of the device to simultaneously check both sides of the fuse without the need to have an operative electrical load connected with the fuse.

SUMMARY OF THE INVENTION

Briefly stated, in accordance with one aspect of the present invention a test device for testing for current flow in an electrical circuit is provided. The test device includes a pair of terminal contacts for making electrical contact with respective portions of a an electrical circuit. A pair of light sources is provided, and each light source is electrically connected with a respective one of the terminal contacts. A ground contact is electrically connected with each of the light sources for completing an electrical circuit through the respective light sources to cause the light sources to indicate the flow of current therethrough and thereby indicate the portion of the circuit through which current is flowing.

In accordance with another aspect of the present invention, the test device is in the form of a fuse checker for testing the integrity of a safety fuse while the fuse is in its operative position in an electrical circuit. The checker includes a pair of fuse terminal contacts f or making electrical contact with end parts of a fuse-forming link extending between a pair of fuse terminals. A pair of light sources is provided, each light source electrically connected with a respective one of the fuse terminal contacts. A ground contact is provided and is electrically connected with each of the light sources for completing an electrical circuit through at least one of the light sources for indicating the condition of the fuse.

DESCRIPTION OF THE PREFERRED EMBODIMENTS

Figure 1:
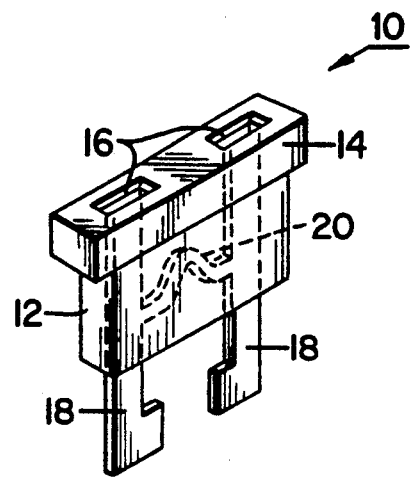
FIG. 1 is a perspective view showing a miniature, plug-in fuse of the type commonly used in automobile electrical circuits, which the fuse checker in accordance with the present invention is particularly adapted to check for fuse integrity.
Figure 2:
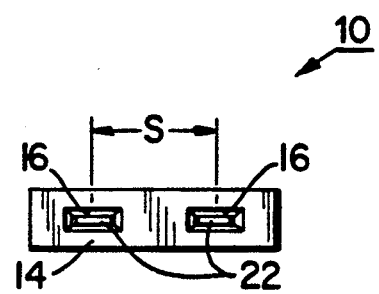
FIG. 2 is a top view of the fuse shown in FIG. 1.

Referring now to the drawings, and particularly to FIGS. 1 and 2 thereof, there is shown a miniature, plug-in fuse 10 of a type that is now in widespread use in automobile electrical circuits. Fuse 10 includes a housing 12, which advantageously is made from injection molded thermoplastic material, such as, for example, polystyrene. Housing 12 is of colored plastic material, the color indicative of the current rating of the fuse, and includes a generally rectangular top wall 14 that has a pair of longitudinally spaced terminal access openings 16 that extend through top wall 14 to the interior of fuse housing 12.

Positioned within housing 12 and extending from the opposite end of housing 12 from top wall 14 are a pair of parallel, spaced, blade-type fuse terminals 18 that are adapted to be received within a correspondingly spaced pair of fuse receptacle contacts within a plastic fuse block, or the like (not shown). Fuse terminals 18 have a length sufficient for them to extend outwardly from the lower end of housing 12, and also to extend into housing 12 to be received and tightly held by the housing by suitable terminal anchoring arrangements (not shown). Extending between each of fuse terminals 18 within fuse housing 12 is a fusible link 20 that has a size and that is made from a material that permits the passage between fuse terminals 18 of currents less than the rated current value of the fuse, and that will melt or separate if a current greater than the rated current value of the fuse passes through the fusible link.

As best seen in FIG. 2, fuse terminals 18 each include an elongated terminal tab 22 that extends into a respective terminal access opening 16 to enable contact to be made with the terminals when the fuse is in its operative position in a fuse block. In that regard, the spacing S between corresponding portions of tabs 22 is generally about ⅛ inch. Additional structural and functional details of such miniature, plug-in fuses are disclosed in U.S. Pat. No. 3,909,767, which issued on Sep. 30, 1975, to Harold L. Williamson et al., the disclosure of which is incorporated herein by reference to the same extent as if fully set forth herein.

Figure 3:
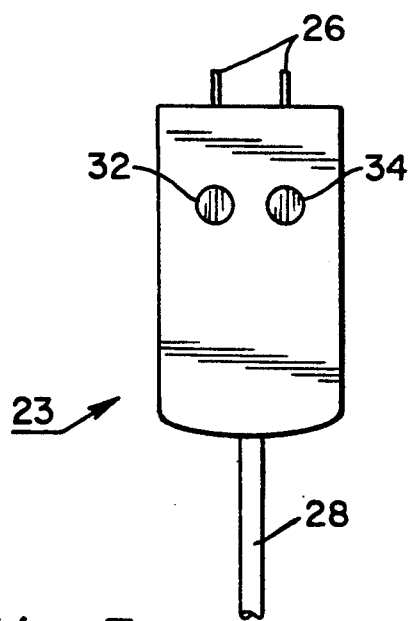
FIG. 3 is a plan view showing the overall structure of a fuse checker in accordance with the present invention.

A fuse checker 23 in accordance with the present invention is shown in FIG. 3. Fuse checker 23 includes a housing 24, which can be of generally rectangular configuration, as shown, or it can be any other convenient shape for convenience in holding and applying the checker to a fuse for operational integrity checking. A pair of spaced, substantially parallel, contact points 26 extend outwardly from one longitudinal end of housing 24. Contact points 26 can each be defined by an 18 gauge (0.040 inch) solid wire, or the like, and they preferably are spaced a distance corresponding with the lateral spacing between terminal tabs 22 of a plug-in fuse 10 of the type shown in FIGS. 1 and 2. The lengths of contact points 26 can be any convenient length, such as, for example 3/16 inch, to permit simultaneous contact of each contact point 26 with a respective terminal tab 22 of a plug-in-type fuse. A ground lead 28 of suitable length, such as about 24 inches or so, and which can be defined by an 18 gauge stranded wire, or the like, for flexibility, extends outwardly from the opposite longitudinal end of housing 24 from contact points 26 and terminates in a ground terminal clip 30, which can be of any convenient type, such as an alligator clip, as shown.

Checker housing 24 includes in one face thereof a pair of lenses 32 and 34, one lens 32 preferably colored yellow, and the other lens 34 preferably colored red, or any other colors that might be desired. Each of lenses 32 and 34 is adapted to transmit light that is generated by a pair of light sources positioned within checker housing 24 when the checker is in use, as will be hereinafter explained.

Figure 4:
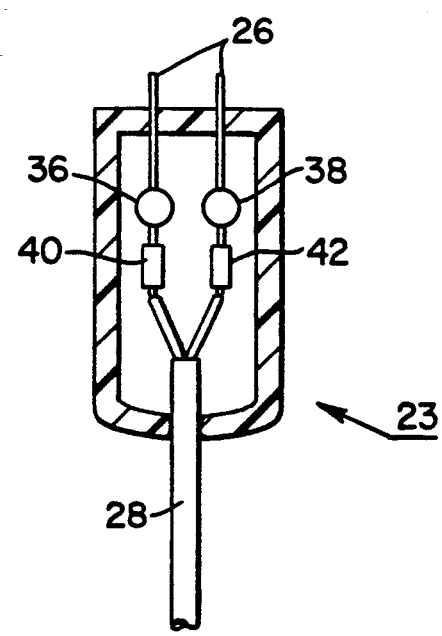
FIG. 4 is a fragmentary, longitudinal, cross-sectional view of the housing portion of the fuse checker shown in FIG. 3.

Housing 24 is preferably made from a non-electrically-conductive molded plastic material, and can be manufactured by injection molding materials such as polypropylene, polystyrene, or the like. As illustrated in cross section in FIG. 4, housing 24 can be a hollow structure within which the internally positioned circuit elements to be hereinafter described are positioned. Alternatively, if desired, housing 24 can be defined by a solid material that fully surrounds and encapsulates the circuit elements therein contained, to protect the circuit elements from damage from shock and vibration, and to exclude moisture and corrosive agents from coming into contact with the circuit elements.

Referring once again to FIG. 4, positioned between each of contact points 26 and ground lead 28 are a pair of light sources 36, 38. The light sources are positioned to be adjacent lenses 32, 34, respectively. Current limiting resistors 40, 42 are connected between light sources 36, 38, respectively, and ground lead 28 to limit the current flow through the light sources. A preferred light source is a light emitting diode (LED) and if such light sources are employed the light sources and lenses can be provided in a unitary structure. When LED's are provide for the light sources, each of resistors 40 and 42 can be a 470 ohm, ¼ watt resistor to permit the device to be used as a fuse checker in a 12 volt automotive electrical circuit, to avoid overloading the LED'S.

In operation, the ground terminal clip 30 of checker 23 is brought into contact with and securely connected with a part of the automobile frame or chassis to establish a good electrical ground connection. Contact points 26, which have a lateral spacing that corresponds with the spacing between the terminal tabs 22 of the several plug-in-type fuses normally found in an automobile fuse block, are placed into the respective terminal access openings 16 to make electrical contact with respective terminal tabs 22. With the automobile ignition switch (not shown) in the ON position, if both the yellow and the red LED's light then the fuse is in good, operable condition in that fusible link 20 is intact and has not been severed to prevent passage of current through the fuse. However, if only one of the LED's lights, then fusible link 20 has been severed, and no current passes through the LED associated with the non-hot terminal of the fuse receptacle. Consequently, the fuse is defective and must be replaced in order for the circuit in which the fuse is positioned to function properly.

An alternative use of the checker herein described is to determine which of two leads forming part of a given circuit is a hot lead. In testing for which of the leads is a hot lead, ground terminal clip 30 is again securely connected with the frame or chassis to establish a good ground connection, after which each of the leads to be tested is individually brought into contact with one of the contact points. The hot lead will cause the LED associated with the contact point on the same side of the checker housing 24 to light, whereas the non-hot lead will not cause its associated LED to light, thereby permitting a quick and accurate determination of which of several leads are hot leads and which are not. In the event it is desired to determine which side of a fuse receptacle is the hot side, the fuse is first removed from the fuse receptacle, and then the procedure described above is followed to identify the hot side.

As will be apparent, the present invention provides distinct advantages over the prior art devices in that it permits both sides of a fuse to be tested in a single operation, and without the need to remove the fuse from the fuse block. The device is simple, convenient, and is always ready for use, because it does not require any internal power sources, such as batteries.

Although particular embodiments of the present invention have been illustrated and described, it will be apparent to those skilled in the art that various changes and modifications can be made without departing from the spirit of the present invention. Accordingly, it is intended to encompass within the appended claims all such changes and modifications that fall within the scope of the present invention.

What is claimed is:

1. A fuse checker for testing the integrity of a miniature, plug-in fuse while the fuse is in operative position in a direct current electrical circuit, said checker comprising:
   (a) a fuse checker housing including a pair of outwardly extending fuse terminal contacts that are each receivable in a respective one of a pair of spaced recesses formed in a fuse housing of a miniature, plug-in fuse for making electrical contact with respective end portions of a fuse-forming link extending between and connected with a pair of fuse terminals extending from the fuse housing, wherein the fuse terminal contacts are spaced from each other a distance corresponding with the spacing between the recesses in the fuse housing and wherein the fuse terminal contacts each are of a size to permit each terminal contact to be received in a respective one of the recesses in the fuse housing and to be electrically connected with the respective end portions of the fuse-forming link;

(b) a pair of light sources carried by the fuse checker housing, and a current limiting resistor connected in series with each of the light sources, wherein each light source is a light emitting diode that includes a pair of terminals, a first terminal of each light emitting diode electrically connected with a respective one of said fuse terminal contacts; and (c) a ground contact extending form the fuse checker housing and electrically connected with a second terminal of each of the light emitting diode light sources through its associated resistor for completing a unidirectional electrical flow path through the respective light sources from the respective fuse terminal contacts to a ground connection of a circuit including the fuse-forming link to be integrity tested for indicating the operative condition of a fuse, wherein upon energizing the circuit that includes the fuse-forming link to be integrity tested both light emitting diode light sources emit light when the fuse-forming link is intact, and wherein only one of the light emitting diode light sources emits light when the fuse-forming link has been severed, to visually indicate the operative condition of the fuse while the fuse is in an operative position in the circuit.

2. A fuse checker in accordance with claim 1 including a housing from which the fuse terminals and ground contact each extend, and in which each of the light sources include lenses that are positioned to lie in an outer surface of the housing.

3. A fuse checker in accordance with claim 2 wherein the housing is hollow.

4. A fuse checker in accordance with claim 2 wherein the housing is defined by an electrically non-conductive encapsulation material within which the fuse terminal contacts, the light sources, and the ground contacts are embedded.

5. A fuse checker in accordance with claim 1 wherein the ground contact is an alligator clip.

6. A fuse checker in accordance with claim 1 wherein the fuse terminal contacts are each defined by an 18 gage wire.

7. A test device for testing for current flow in a direct current electrical circuit to determine which of two spaced portions of the circuit is the hot side, said test device comprising:

(a) a housing including pair of terminal contacts for making electrical contact with a pair of spaced, unconnected portions of a direct current electrical circuit;

(b) a pair of light sources carried by the test device housing, and a current limiting resistor connected in series with each of the light sources, wherein each light source is a light emitting diode that includes a pair of terminals, a first terminal of each light emitting diode electrically connected with a respective one of said terminal contacts; and (c) a ground contact extending form the test device housing and electrically connected with each of the light emitting diode light sources through its associated resistor for completing a unidirectional electrical flow path through the respective light emitting diode light sources to cause the light sources to light when current flows therethrough and thereby indicate the portion of the circuit through which current is flowing, whereby when the terminal contacts are simultaneously brought into electrical contact with respective ones of two spaced, unconnected portions of a circuit only the light emitting diode light source connected with the terminal contact engaging the hot side of the circuit emits light.

* * * * *